US012578281B2

(12) United States Patent
Fujiki et al.

(10) Patent No.: US 12,578,281 B2
(45) Date of Patent: Mar. 17, 2026

(54) DEFECT INSPECTION APPARATUS AND DEFECT INSPECTION METHOD

(71) Applicant: Lasertec Corporation, Kanagawa (JP)

(72) Inventors: Shota Fujiki, Yokohama (JP); Yoshito Ozaki, Yokohama (JP)

(73) Assignee: LASERTEC CORPORATION, Yokohama (JP)

( * ) Notice: Subject to any disclaimer, the term of this patent is extended or adjusted under 35 U.S.C. 154(b) by 169 days.

(21) Appl. No.: 18/627,697

(22) Filed: Apr. 5, 2024

(65) Prior Publication Data

US 2024/0337603 A1     Oct. 10, 2024

(30) Foreign Application Priority Data

Apr. 5, 2023     (JP) ................................. 2023-061116

(51) Int. Cl.
| | |
|---|---|
| *G01N 21/88* | (2006.01) |
| *G01N 21/359* | (2014.01) |
| *G01N 21/64* | (2006.01) |
| *G01N 21/84* | (2006.01) |
| *G01N 21/95* | (2006.01) |
| *H01L 21/66* | (2006.01) |

(52) U.S. Cl.
CPC ....... *G01N 21/8851* (2013.01); *G01N 21/359* (2013.01); *G01N 21/6489* (2013.01); *G01N 21/9501* (2013.01); *G01N 21/9505* (2013.01); *G01N 2021/646* (2013.01); *G01N 2021/8477* (2013.01); *G01N 2021/8861* (2013.01); *G01N 2021/8887* (2013.01); *H01L 22/12* (2013.01); *H01L 22/24* (2013.01)

(58) Field of Classification Search
CPC ............. G01N 21/8851; G01N 21/359; G01N 21/6489; G01N 21/9501; G01N 21/9505; G01N 2021/646; G01N 2021/8477; G01N 2021/8861; G01N 2021/8887; H01L 22/12; H01L 22/24
See application file for complete search history.

(56) References Cited

U.S. PATENT DOCUMENTS

| | | | |
|---|---|---|---|
| 2015/0168311 A1 | 6/2015 | Seki et al. | |
| 2019/0172758 A1 | 6/2019 | Nishihara et al. | |

FOREIGN PATENT DOCUMENTS

| | | | | |
|---|---|---|---|---|
| JP | 2015-119056 A | 6/2015 | | |
| JP | 2019-099438 A | 6/2019 | | |
| JP | 6999212 B1 | 1/2022 | | |
| KR | 20230037309 A | * 3/2023 | ............. | H01L 22/12 |

* cited by examiner

*Primary Examiner* — Tarifur R Chowdhury
*Assistant Examiner* — Kaitlyn E Kidwell
(74) *Attorney, Agent, or Firm* — ALSTON & BIRD LLP

(57)     ABSTRACT

A defect inspection apparatus according to the present embodiment includes: an irradiation optical system configured to irradiate a sample including a SiC substrate, a buffer layer formed on the SiC substrate, and a drift layer formed on the buffer layer with excitation light; a filter unit configured to control a wavelength band to transmit photoluminescence light generated from the sample; a detection optical system configured to detect the photoluminescence light transmitted through the filter unit; and an image processing unit configured to form an image from the detected photoluminescence light and to discriminate a defect captured in the formed image, and the image processing unit discriminates the defect based on whether a length of the defect is $L1=(D1+D2)/\tan \theta$ or $L2=D2/\tan \theta$.

10 Claims, 8 Drawing Sheets

START

IRRADIATE SAMPLE WITH EXCITATION LIGHT ⌐S11

TRANSMIT PHOTOLUMINESCENCE LIGHT THROUGH FILTER UNIT ⌐S12

DETECT PHOTOLUMINESCENCE LIGHT ⌐S13

FORM IMAGE ⌐S14

DISCRIMINATE DEFECT ⌐S15

END

| | APPEARANCE OF BPD | |
|---|---|---|
| 420nm BAND LIGHT RECEPTION | —————— | ——— |
| | $L1=(D1+D2)/\tan\theta$ | $L2=D2/\tan\theta$ |
| NIR BAND LIGHT RECEPTION | ———— | |
| | $L3=D1/\tan\theta = L1-L2$ | |

Fig. 7

DEFECT INSPECTION APPARATUS AND DEFECT INSPECTION METHOD

INCORPORATION BY REFERENCE

This application is based upon and claims the benefit of priority from Japanese patent application No. 2023-061116, filed on Apr. 5, 2023, the disclosure of which is incorporated herein in its entirety by reference.

BACKGROUND

The present disclosure relates to a defect inspection apparatus and a defect inspection method.

Since silicon carbide (referred to as SiC, hereinafter) has excellent physical characteristics and thermal characteristics, it is useful for manufacturing a semiconductor device of a high withstand voltage and low loss. A SiC epitaxial wafer is a wafer in which an epitaxial layer containing SiC is formed on a SiC substrate. In a process of manufacturing a semiconductor device using the SiC epitaxial wafer, in order to improve a manufacturing yield, it is extremely important to detect defects present in the epitaxial layer and to classify the detected defects. In particular, a basal plane dislocation (referred to as a BPD, hereinafter) becomes a killer defect that exerts a fatal and adverse influence on performance of a semiconductor device when manufacturing the semiconductor device on the SiC epitaxial wafer. Therefore, it is strongly desired to distinguish the BPD from other defects and to detect it.

In a SiC epitaxial wafer in which a drift layer containing SiC is formed on a SiC substrate, a structure may be such that a buffer layer doped with impurities in a high concentration is held between the drift layer and the SiC substrate, in order to prevent generation of the BPD in the drift layer. By such a structure, the BPD in the buffer layer can be converted to a threading edge dislocation (referred to as a TED, hereinafter) at an interface of the buffer layer and the drift layer. The killer defect is generally the BPD in the drift layer. Therefore, by converting the BPD in the buffer layer to the TED in the drift layer, the generation of the killer defect in the drift layer can be suppressed.

However, when long-term reliability is considered, it is desirable to detect even the BPD that is present only in the buffer layer and is converted to the TED at the interface of the buffer layer and the drift layer.

SUMMARY

Japanese Unexamined Patent Application Publication No. 2015-119056 describes a defect inspection apparatus which irradiates a SiC epitaxial wafer with ultraviolet light and detects a defect from generated photoluminescence light. The defect inspection apparatus of Japanese Unexamined Patent Application Publication No. 2015-119056 detects a BPD in a drift layer from an image of a wavelength band of near infrared light in the photoluminescence light. However, it is difficult for the defect inspection apparatus of Japanese Unexamined Patent Application Publication No. 2015-119056 to detect a BPD in a buffer layer.

Japanese Patent No. 6999212 describes converting the BPD in a drift layer and a buffer layer to a Shockley type stacking fault (referred to as an SSF, hereinafter) and detecting the BPD by photoluminescence light from the converted SSF. A method in Japanese Patent No. 6999212 can detect the BPD in the buffer layer, however, the BPD needs to be converted to the SSF and processes required for inspection are extremely complicated.

Japanese Unexamined Patent Application Publication No. 2019-099438 describes detecting a BPD in a high-concentration epitaxial layer by photoluminescence light transmitted in a wavelength band of 430 nm or shorter. A defect inspection apparatus of Japanese Unexamined Patent Application Publication No. 2019-099438 can detect the BPD in the high-concentration epitaxial layer as a linear defect that is black as compared with circumference. However, a relation between the detected BPD and a TED in a drift layer is not described at all.

It is desired to discriminate whether a BPD continues from a buffer layer to a drift layer or is present only in the buffer layer in a SiC epitaxial wafer.

The present disclosure is implemented in consideration of such problems and provides a defect inspection apparatus and a defect inspection method capable of discriminating a BPD in a SiC epitaxial wafer.

A defect inspection apparatus according to one aspect of a present embodiment includes: an irradiation optical system configured to irradiate a sample including a silicon carbide substrate, a buffer layer formed on the silicon carbide substrate, and a drift layer formed on the buffer layer with excitation light; a filter unit configured to control a wavelength band to transmit photoluminescence light generated from the sample; a detection optical system configured to detect the photoluminescence light transmitted through the filter unit; and an image processing unit configured to form an image from the detected photoluminescence light and to discriminate a defect captured in the formed image, the filter unit transmits the wavelength band including 420 nm or longer and 430 nm or shorter in the photoluminescence light, and when a thickness of the drift layer is defined as D1, a thickness of the buffer layer is defined as D2, an offset angle is defined as θ, and a first length and a second length are defined as L1 and L2 indicated respectively as follows:

$$L1 = (D1 + D2)/\tan\theta$$

$$L2 = D2/\tan\theta,$$

the image processing unit discriminates the defect as the defect including a basal plane dislocation continuing from the buffer layer to the drift layer in a case where a length of the defect belongs to a predetermined first range including the first length, and discriminates the defect as the defect including the basal plane dislocation in the buffer layer and an edge dislocation in the drift layer in the case where the length of the defect belongs to a predetermined second range including the second length, the second range being different from the first range.

In the defect inspection apparatus described above, the filter unit may change the wavelength band to be transmitted from the wavelength band including 420 nm or longer and 430 nm or shorter to the wavelength band including near infrared light, the detection optical system may detect the near infrared light transmitted through the changed filter unit, and the image processing unit, when forming a near infrared image from the detected near infrared light and discriminating the defect captured in the formed near infrared image, in the case where a third length is defined as L3 indicated as follows:

$$L3 = D1/\tan\theta,$$

may discriminate the defect as the defect including the basal plane dislocation in the drift layer in the case where the length of the defect belongs to a predetermined third range including the third length, the third range being different from the first range and the second range.

In the defect inspection apparatus described above, the image processing unit may calculate accuracy of the discriminated defect by comparing the number of the defects having the length belonging to the first range and the number of the defects having the length belonging to the third range.

In the defect inspection apparatus described above, the image processing unit may discriminate the defect captured in the image by using an algorithm for which the plurality of defects belonging to the first range and the plurality of defects belonging to the second range are machine-learned beforehand as learning data.

In the defect inspection apparatus described above, an impurity concentration of the drift layer may be $1 \times 10^{15}$ cm$^{-3}$ or higher and lower than $5 \times 10^{17}$ cm$^{-3}$, and the impurity concentration of the buffer layer may be $5 \times 10^{17}$ cm$^{-3}$ or higher and $1 \times 10^{19}$ cm$^{-3}$ or lower.

A defect inspection method according to one aspect of the present embodiment includes: a step of irradiating a sample including a silicon carbide substrate, a buffer layer formed on the silicon carbide substrate, and a drift layer formed on the buffer layer with excitation light; a step of transmitting photoluminescence light generated from the sample through a filter unit that controls a wavelength band to be transmitted; a step of detecting the photoluminescence light transmitted through the filter unit; a step of forming an image from the detected photoluminescence light; and a step of discriminating a defect captured in the formed image, and in the step of transmitting the photoluminescence light, the filter unit transmits the wavelength band including 420 nm or longer and 430 nm or shorter in the photoluminescence light, and in the step of discriminating the defect, when a thickness of the drift layer is defined as D1, a thickness of the buffer layer is defined as D2, an offset angle is defined as θ, and a first length and a second length are defined as L1 and L2 indicated respectively as follows:

$$L1 = (D1 + D2)/\tan\theta$$

$$L2 = D2/\tan\theta,$$

the defect is discriminated as the defect including a basal plane dislocation continuing from the buffer layer to the drift layer in a case where a length of the defect belongs to a predetermined first range including the first length, and the defect is discriminated as the defect including the basal plane dislocation in the buffer layer and an edge dislocation in the drift layer in the case where the length of the defect belongs to a predetermined second range including the second length, the second range being different from the first range.

The defect inspection method described above may further include: a step of changing the wavelength band to be transmitted by the filter unit from the wavelength band including 420 nm or longer and 230 nm or shorter to the wavelength band including near infrared light, after the step of discriminating the defect; a step of detecting near infrared light transmitted through the changed filter unit; a step of forming a near infrared image from the detected near infrared light; and a step of discriminating the defect captured in the formed near infrared image, and in the step of discriminating the defect captured in the near infrared image, when a third length is defined as L3 indicated as follows:

$$L3 = D1/\tan\theta,$$

the defect may be discriminated as the defect including the basal plane dislocation in the drift layer in the case where the length of the defect captured in the near infrared image belongs to a predetermined third range including the third length, the third range being different from the first range and the second range.

The defect inspection method described above may further include a step of calculating accuracy of the discriminated defect by comparing the number of the defects having the length belonging to the first range and the number of the defects having the length belonging to the third range.

In the defect inspection method described above, the defect captured in the image may be discriminated by using an algorithm for which the plurality of defects belonging to the first range and the plurality of defects belonging to the second range are machine-learned beforehand as learning data.

In the defect inspection method described above, an impurity concentration of the drift layer may be $1 \times 10^{15}$ cm$^{-3}$ or higher and lower than $5 \times 10^{17}$ cm$^{-3}$, and the impurity concentration of the buffer layer may be $5 \times 10^{17}$ cm$^{-3}$ or higher and $1 \times 10^{19}$ cm$^{-3}$ or lower.

According to the present disclosure, it is possible to provide a defect inspection apparatus and a defect inspection method capable of discriminating a BPD in a SiC epitaxial wafer.

The above and other objects, features and advantages of the present disclosure will become more fully understood from the detailed description given hereinbelow and the accompanying drawings which are given by way of illustration only, and thus are not to be considered as limiting the present disclosure.

BRIEF DESCRIPTION OF DRAWINGS

FIG. 7 is a diagram illustrating appearance of a BPD in a defect captured in the defect inspection apparatus according to the embodiment 1 and the defect inspection apparatus according to the embodiment 2.

DESCRIPTION OF EMBODIMENTS

Hereinafter, embodiments of the present disclosure will be described with reference to the drawings. The following description indicates ideal embodiments of the present disclosure, and a scope of the present disclosure is not limited to the embodiments below. In the following description, same signs are attached to indicate practically similar contents.

Embodiment 1

Figure 1:
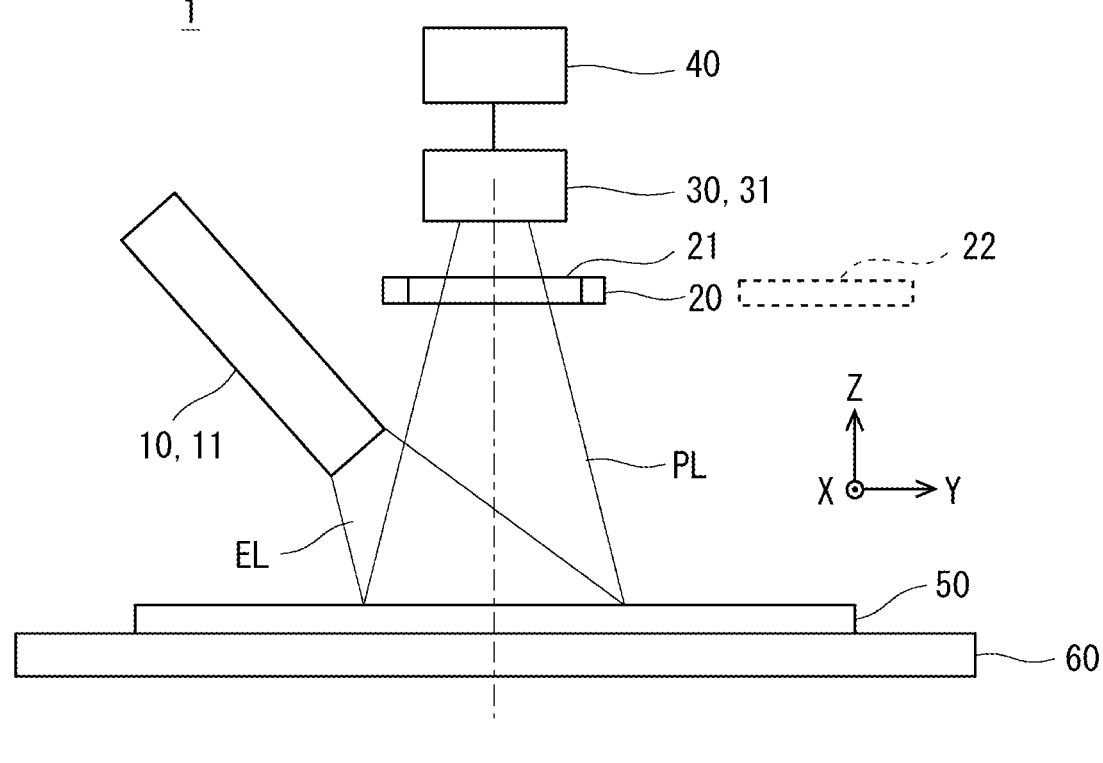
FIG. 1 is a block diagram illustrating a defect inspection apparatus according to an embodiment 1.

A defect inspection apparatus and a defect inspection method according to the embodiment 1 will be described. FIG. 1 is a block diagram illustrating a defect inspection apparatus 1 according to the embodiment 1. As illustrated in FIG. 1, the defect inspection apparatus 1 according to the present embodiment includes an irradiation optical system 10, a filter unit 20, a detection optical system 30, and an image processing unit 40.

The irradiation optical system 10 irradiates a sample 50 mounted on a stage 60 with excitation light EL. The irradiation optical system 10 may include a light source 11. In addition, the irradiation optical system 10 may include a filter and an optical member such as a mirror and a lens. The irradiation optical system 10 irradiates a SiC epitaxial wafer to be the sample 50 with the excitation light EL. The excitation light EL may include, for example, ultraviolet light that generates photoluminescence light PL from the SiC epitaxial wafer. That is, the excitation light EL has energy greater than energy of a SiC forbidden bandwidth.

For example, the excitation light EL may be a laser beam having a wavelength of 320 nm, that is generated from a He—Cd laser, or may be a fourth harmonic wave laser beam having a wavelength of 266 nm, that is generated from a YAG laser. Further, the excitation light EL may be ultraviolet light generated from a mercury xenon lamp. The irradiation optical system 10 may transmit a predetermined wavelength band in the excitation light EL by a filter. For example, when the light source 11 is the mercury xenon lamp, the excitation light EL may include a beam having a wavelength of 313 nm transmitted through the filter. The irradiation optical system 10 may include an optical member such as a mirror and a lens on an optical path through which the sample 50 is irradiated with the excitation light EL emitted from the light source 11. For example, by using a galvanometer mirror or the like, an inspection surface of the sample 50 may be scanned with the excitation light EL. Alternatively, the inspection surface of the sample 50 may be scanned with the excitation light EL by moving the stage 60.

Here, for convenience of the description of the defect inspection apparatus 1, an XYZ orthogonal coordinate axis system is introduced. A direction orthogonal to an upper surface of the stage 60 is defined as a Z axis direction, and a plane parallel to the upper surface of the stage 60 is defined as an XY plane. For example, a +Z axis direction is an upper part and a −Z axis direction is a lower part. Note that the upper part and the lower part are directions for the convenience of the description of the defect inspection apparatus 1, and do not indicate the directions in which the defect inspection apparatus 1 is actually disposed.

The filter unit 20 controls the wavelength band to transmit the photoluminescence light PL generated from the sample

50. Specifically, for example, the filter unit 20 may include a filter 21 which transmits the wavelength band including 420 nm or longer and 430 nm or shorter in the photoluminescence light PL. The filter 21 transmits the wavelength band including 420 nm or longer and 430 nm or shorter in the photoluminescence light PL. For example, the filter 21 may transmit the wavelength band including a center wavelength 425±13 nm, or may transmit the wavelength band including the center wavelength 425±5 nm.

In addition, the filter unit 20 may include a filter 22 which transmits the wavelength band including near infrared light. The filter 22 transmits, for example, the wavelength band including 700 nm to 1100 nm. The filter unit 20 may select the filter 21 or the filter 22 according to the wavelength band to be detected.

The detection optical system 30 includes a detector 31. The detection optical system 30 detects the photoluminescence light PL transmitted through the filter unit 20. Note that the detection optical system 30 may include, in addition to the detector 31, an optical member, such as a lens and a mirror, which guides the photoluminescence light PL transmitted through the filter unit 20 to the detector 31.

The detector 31 may include an image sensor in which solid-state imaging elements such as CCDs (charge-coupled devices) and CMOSs (complementary metal-oxide-semiconductors) are arrayed in a two-dimensional array shape, or may include a line sensor in which the plurality of imaging elements are lined up.

The image processing unit 40 forms an image from the photoluminescence light PL detected by the detection optical system 30. The image processing unit 40 discriminates a defect captured in the formed image. The image processing unit 40 is, for example, a computer including a CPU, a memory, and a storage or the like. The image processing unit 40 may be provided with input/output means including a display or the like for displaying the image.

Figure 2:
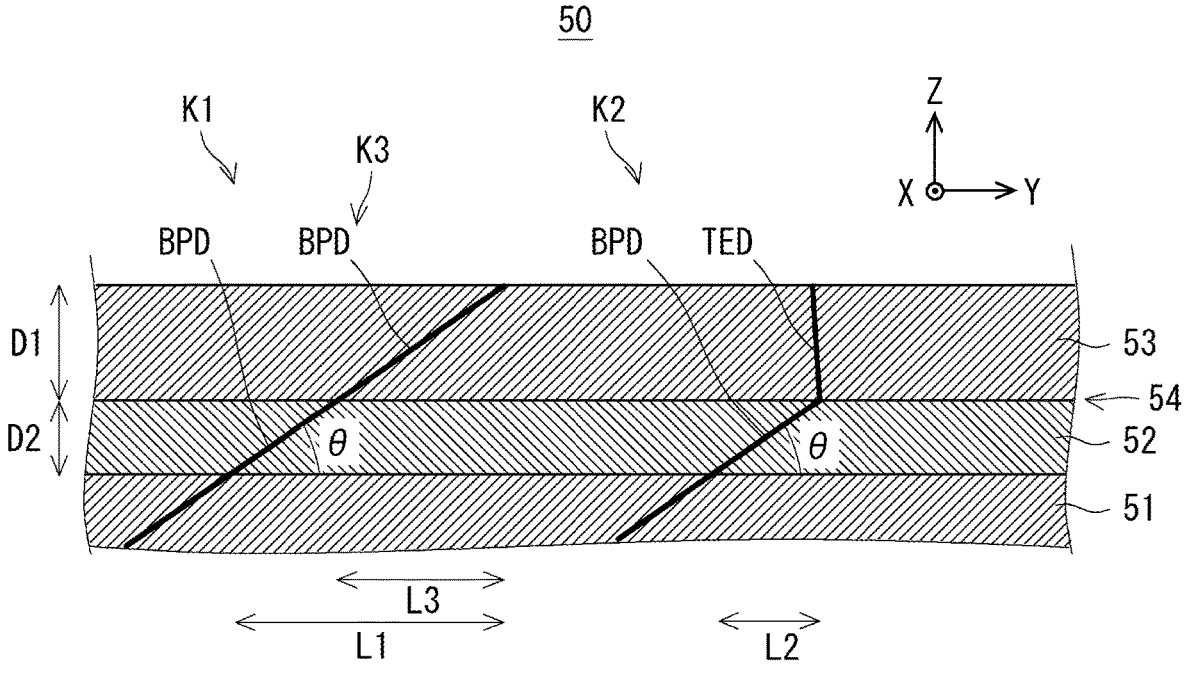
FIG. 2 is a sectional view illustrating a sample to be an inspection target in the defect inspection apparatus according to the embodiment 1.

FIG. 2 is a sectional view illustrating the sample 50 to be an inspection target in the defect inspection apparatus 1 according to the embodiment 1. As illustrated in FIG. 2, the sample 50 includes a SiC substrate 51, a buffer layer 52, and a drift layer 53. The sample 50 has a structure in which the SiC substrate 51, the buffer layer 52, and the drift layer 53 are laminated. The buffer layer 52 is formed on the SiC substrate 51, and the drift layer 53 is formed on the buffer layer 52. Therefore, the buffer layer 52 is disposed between the SiC substrate 51 and the drift layer 53.

The SiC substrate 51 is to be a base for thin film fabrication of the buffer layer 52 and the drift layer 53 by an epitaxial growth method. The SiC substrate 51 is a substrate containing a SiC monocrystal (4H-SiC). A manufacturing method of the SiC substrate 51 does not matter in particular. For example, the SiC substrate 51 is obtained by slicing a SiC ingot obtained by a sublimation method or the like. In the SiC substrate 51, a BPD may be present along a (0001) surface (c surface).

The buffer layer 52 and the drift layer 53 are thin films containing the SiC monocrystal (4H-SiC) deposited on the SiC substrate 51 by the epitaxial growth method. An epitaxial layer including the buffer layer 52 and the drift layer 53 may be, specifically, formed on the SiC substrate 51 for which a surface having an offset angle in a <11-20> direction from the (0001) surface is a growth surface, for example. The epitaxial layer may be 4H-SiC that is grown in a step flow manner (laterally grown from an atomic step) on the SiC substrate 51.

The buffer layer 52 is a layer for which the epitaxial layer containing impurities in a high concentration is epitaxially grown on the SiC substrate 51. For the impurities to be doped, nitrogen, boron, titanium, vanadium, aluminum, gallium, and phosphorus or the like may be used. The buffer layer 52 functions to suppress reaching of minority carriers to the drift layer 53 in a power device, for example. By laminating the buffer layer 52, when a current is made to flow in a forward direction of a bipolar device that has a BPD, the minority carriers can be prevented from reaching the BPD present in the SiC substrate 51.

The drift layer 53 is a layer for which the epitaxial layer containing impurities in a low concentration is epitaxially grown on the buffer layer 52. For the impurities to be doped, similarly to the buffer layer 52 described above, nitrogen, boron, titanium, vanadium, aluminum, gallium, and phosphorus or the like may be used. The drift layer 53 is doped with the impurities in a lower concentration as compared to the buffer layer 52, and functions as a drift layer of a SiC-MOSFET, for example.

An impurity concentration of the buffer layer 52 is preferably $1 \times 10^{18}$ cm$^{-3}$ or higher. For example, the impurity concentration of the buffer layer 52 is $5 \times 10^{17}$ cm$^{-3}$ or higher and $1 \times 10^{19}$ cm$^{-3}$ or lower. The impurity concentration of the drift layer is preferably about $1 \times 10^{16}$ cm$^{-3}$. For example, the impurity concentration of the drift layer is $1 \times 10^{15}$ cm$^{-3}$ or higher and lower than $5 \times 10^{17}$ cm$^{-3}$.

A thickness D2 of the buffer layer 52 is, for example, 1 μm. Note that the thickness D2 of the buffer layer 52 is not limited to 1 μm. A thickness D1 of the drift layer 53 is, for example, 10 μm. Note that the thickness D1 of the drift layer 53 is not limited to 10 μm. It is desirable that the thickness D1 of the drift layer 53 is different from the thickness D2 of the buffer layer 52. For example, it is desirable that the thickness D1 of the drift layer 53 is greater than the thickness D2 of the buffer layer 52, however, it does not matter.

In the sample 50, some BPDs are inherited to the drift layer 53. That is, a defect K1 formed in the sample 50 includes the BPD that continues from the buffer layer 52 to the drift layer 53, for example. Specifically, the defect K1 includes the BPD which passes through the buffer layer 52 from the SiC substrate 51 and reaches the drift layer 53. In such a defect K1, an angle formed by a direction in which the BPD extends and an upper surface (referred to as a basal plane) of the SiC substrate 51 is an offset angle θ. That is, the BPD extends in a direction of the offset angle θ with respect to the basal plane. The BPD inherited to the drift layer 53 emits the photoluminescence light PL having the wavelength of 710 nm by recombination of carriers generated by irradiation of the sample 50 with the excitation light EL.

On the other hand, there is a case where the BPD is converted to a TED at an interface 54 of the buffer layer 52 and the drift layer 53. In this case, a defect K2 formed in the sample 50 includes the BPD in the buffer layer 52 and the TED in the drift layer 53. Specifically, the defect K2 includes the BPD in the buffer layer 52, and the TED converted from the BPD at the interface 54 of the buffer layer 52 and the drift layer 53. In the defect K2, an angle formed by a direction in which the BPD in the buffer layer 52 extends and the basal plane is the offset angle θ. The BPD in the buffer layer 52 before being converted at the interface 54 does not emit the photoluminescence light PL even when the sample 50 is irradiated with the excitation light EL, since a carrier lifetime in the buffer layer 52 is short.

Figure 3:
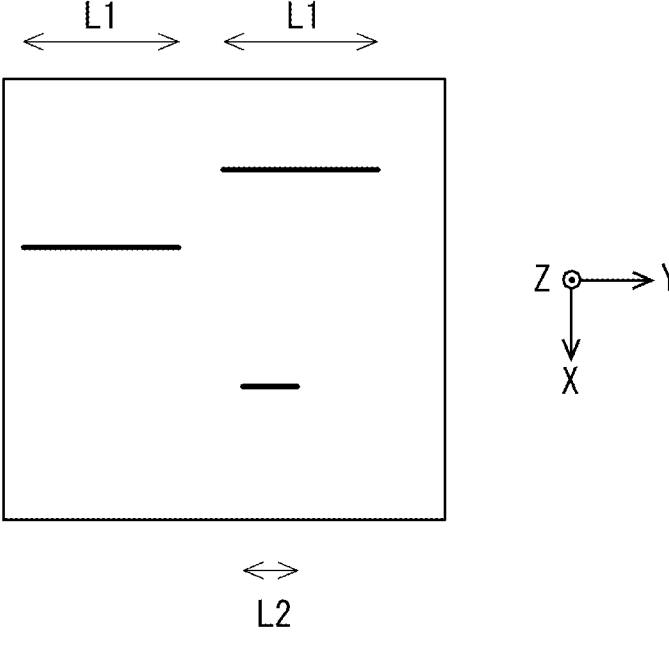
FIG. 3 is a schematic diagram illustrating an image formed by an image processing unit in the defect inspection apparatus according to the embodiment 1.

FIG. 3 is a schematic diagram illustrating the image formed by the image processing unit 40 in the defect inspection apparatus 1 according to the embodiment 1. FIG.

3 is the image formed from the photoluminescence light PL of the sample 50 and captured from the +Z axis direction. For example, FIG. 3 illustrates one visual field at the time of inspection, and is 1.75 mm□ or 1.5 mm□.

As illustrated in FIG. 3, when the image is formed from the photoluminescence light PL of which the wavelength band including 420 nm or longer and 430 nm or shorter is transmitted, in the image, a long linear defect and a short linear defect that are dark (black) as compared with circumference are observed. For example, the black linear defect extends in a Y axis direction. In the Y axis direction, a length of the long linear defect is referred to as a first length L1. A length of the short linear defect is referred to as a second length L2.

Here, the thickness of the drift layer 53 is defined as D1, the thickness of the buffer layer 52 is defined as D2, the offset angle is defined as θ, and the first length and the second length are defined as L1 and L2 indicated respectively by an equation (1) and an equation (2) below. Note that the thickness D1 of the drift layer 53 and the thickness D2 of the buffer layer 52 are desirably different from each other, but may be the same thickness.

$$L1 = (D1 + D2)/\tan\theta \qquad (1)$$

$$L2 = D2/\tan\theta \qquad (2)$$

Then, the defect having the length of the first length L1 corresponds to the defect K1 including the BPD continuing from the buffer layer 52 to the drift layer 53. The defect having the length of the second length L2 corresponds to the defect K2 including the BPD in the buffer layer 52 and the TED in the drift layer 53. Therefore, when the length of the defect captured in the image is the first length L1, the image processing unit 40 discriminates the defect as the defect K1 including the BPD continuing from the buffer layer 52 to the drift layer 53. On the other hand, when the length of the defect captured in the image is the second length L2, the image processing unit 40 discriminates the defect as the defect K2 including the BPD in the buffer layer 52 and the TED in the drift layer 53.

Note that the length of the defect K1 is not limited to the first length L1, and may include the first length L1 including an unavoidable error due to thickness dispersion or the like caused when forming the buffer layer 52 and the drift layer 53. Similarly, the length of the defect K2 is not limited to the second length L2, and may include the second length L2 including the unavoidable error. The unavoidable error may be ±10% of the first length L1 and the second length L2, or may be ±5%, depending on a condition of the thickness or the like when forming the buffer layer 52 and the drift layer 53.

Thus, when the length of the defect captured in the image belongs to a predetermined first range including the first length L1, the image processing unit 40 discriminates the defect as the defect K1 including the BPD continuing from the buffer layer 52 to the drift layer 53. In addition, when the length of the defect captured in the image belongs to a predetermined second range including the second length L2, the second range being different from the first range, the image processing unit 40 discriminates the defect as the defect K2 including the BPD in the buffer layer 52 and the TED in the drift layer 53. The first range is a range of the first length L1 including the unavoidable error and is, for example, the range from (the first length L1−the unavoidable error) to (the first length L1+the unavoidable error). The second range is a range of the second length L2 including the unavoidable error and is, for example, the range from (the second length L2–the unavoidable error) to (the second length L2+the unavoidable error).

As for a calculation method of the length of the defect, calculation may be performed from a pixel count in a region detected as the defect by the image processing unit 40. Further, the image processing unit 40 may discriminate the defect captured in the image by using an algorithm for which the plurality of defects K1 belonging to the first range and the plurality of defects K2 belonging to the second range are machine-learned beforehand as learning data.

Figure 4:
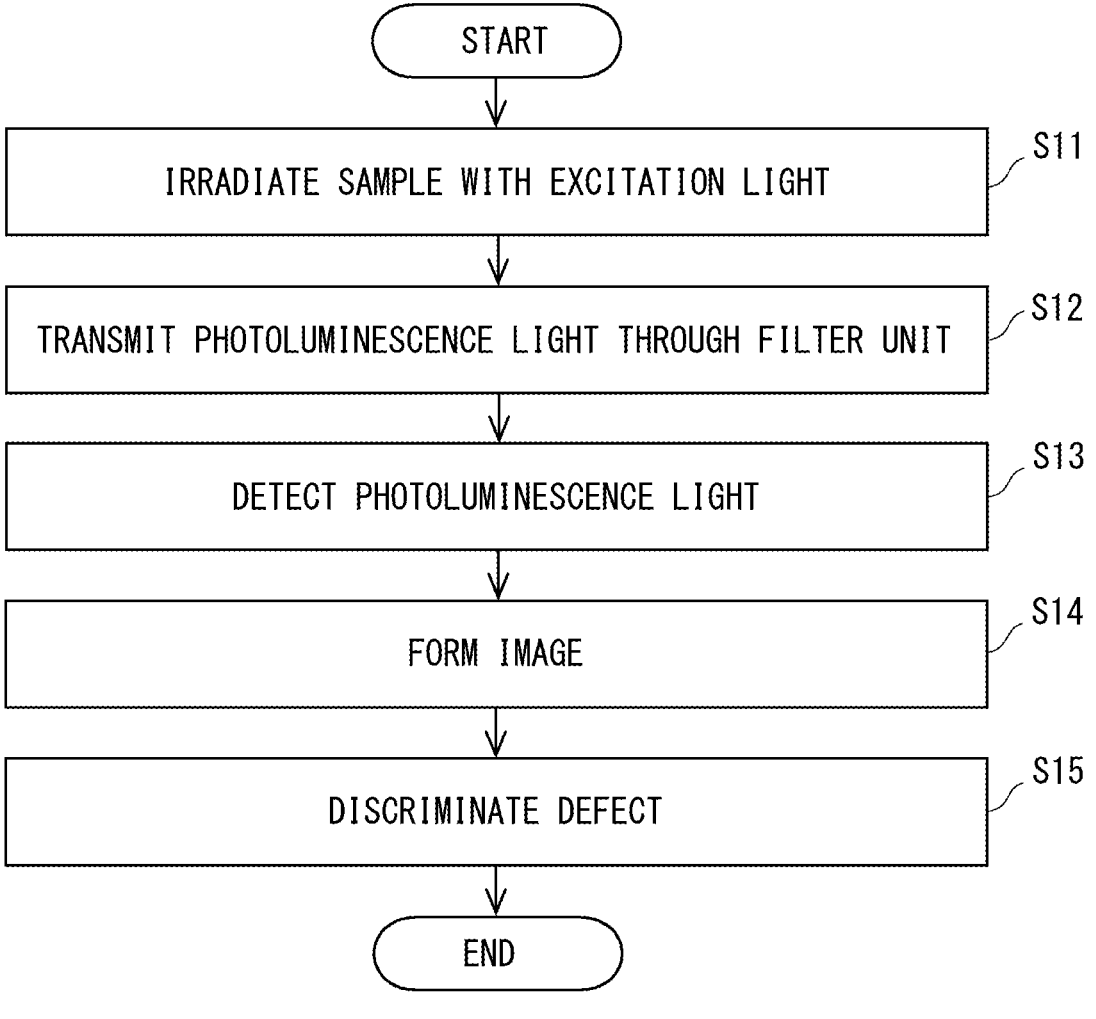
FIG. 4 is a flowchart illustrating a defect inspection method according to the embodiment 1.

Next, the defect inspection method of the present embodiment will be described. FIG. 4 is a flowchart illustrating the defect inspection method according to the embodiment 1. As illustrated in FIG. 4, the defect inspection method of the present embodiment includes step S11 of irradiating the sample 50 with the excitation light EL, step S12 of transmitting the photoluminescence light PL through the filter unit 20, step S13 of detecting the photoluminescence light PL, step S14 of forming an image from the photoluminescence light PL, and step S15 of discriminating a defect captured in the image.

First, as illustrated in step S11, the sample 50 is irradiated with the excitation light EL. The sample 50 includes the SiC substrate 51, the buffer layer 52 formed on the SiC substrate 51, and the drift layer 53 formed on the buffer layer 52. The impurity concentration of the drift layer is $1\times10^{15}$ cm$^{-3}$ or higher and lower than $5\times10^{17}$ cm$^{-3}$ for example, and the impurity concentration of the buffer layer is $5\times10^{17}$ cm$^{-3}$ or higher and $1\times10^{19}$ cm$^{-3}$ or lower for example. Thus, the impurity concentration of the buffer layer 52 is higher than the impurity concentration of the drift layer 53. The irradiation with the excitation light EL is performed by the irradiation optical system 10. The irradiation optical system 10 may scan the sample 50 with the excitation light EL. The sample 50 may be scanned with the excitation light EL by movement of the stage 60. The sample 50 irradiated with the excitation light EL generates the photoluminescence light PL.

Next, as illustrated in step S12, the photoluminescence light PL generated from the sample 50 is transmitted through the filter unit 20. Specifically, the photoluminescence light PL generated from the sample 50 is transmitted through the filter unit 20 which controls the wavelength band to be transmitted. For example, the filter unit 20 transmits the wavelength band including 420 nm or longer and 430 nm or shorter in the photoluminescence light PL by the filter 21.

Next, as illustrated in step S13, the photoluminescence light PL transmitted through the filter unit 20 is detected. For example, the detector 31 in the detection optical system 30 detects the photoluminescence light PL transmitted through the filter 21.

Then, as illustrated in step S14, an image is formed from the detected photoluminescence light PL. Specifically, the image processing unit 40 forms the image from the photoluminescence light PL detected by the detection optical system 30 including the detector 31.

Next, as illustrated in step S15, a defect captured in the formed image is discriminated. For example, when the length of the defect captured in the image belongs to the predetermined first range including the first length L1, the image processing unit 40 may discriminate the defect as the defect K1 including the BPD continuing from the buffer layer 52 to the drift layer 53. In addition, when the length of the defect captured in the image belongs to the predetermined second range including the second length L2, the second range being different from the first range, the image processing unit 40 may discriminate the defect as the defect K2 including the BPD in the buffer layer 52 and the TED in the drift layer 53. In such a manner, the defect in the SiC epitaxial wafer can be inspected.

Next, effects of the present embodiment will be described. The defect inspection apparatus 1 of the present embodiment forms an image from the photoluminescence light PL having the wavelength band including 420 nm or longer and 430 nm or shorter, that is transmitted through the filter 21. Therefore, the image processing unit 40 can detect the BPD formed in the epitaxial layer as a black linear defect in the formed image. In addition, the image processing unit 40 can discriminate the defect by the length of the defect captured in the image. Thus, the defect of the SiC epitaxial wafer can be discriminated.

Further, the defect inspection apparatus 1 can discriminate the BPD in the buffer layer 52. Thus, the BPD that is converted to the TED at the interface 54 of the buffer layer 52 and the drift layer 53 and is present only in the buffer layer 52 can be discriminated, and a device characteristic of the drift layer 53 can be improved.

Embodiment 2

Figure 5:
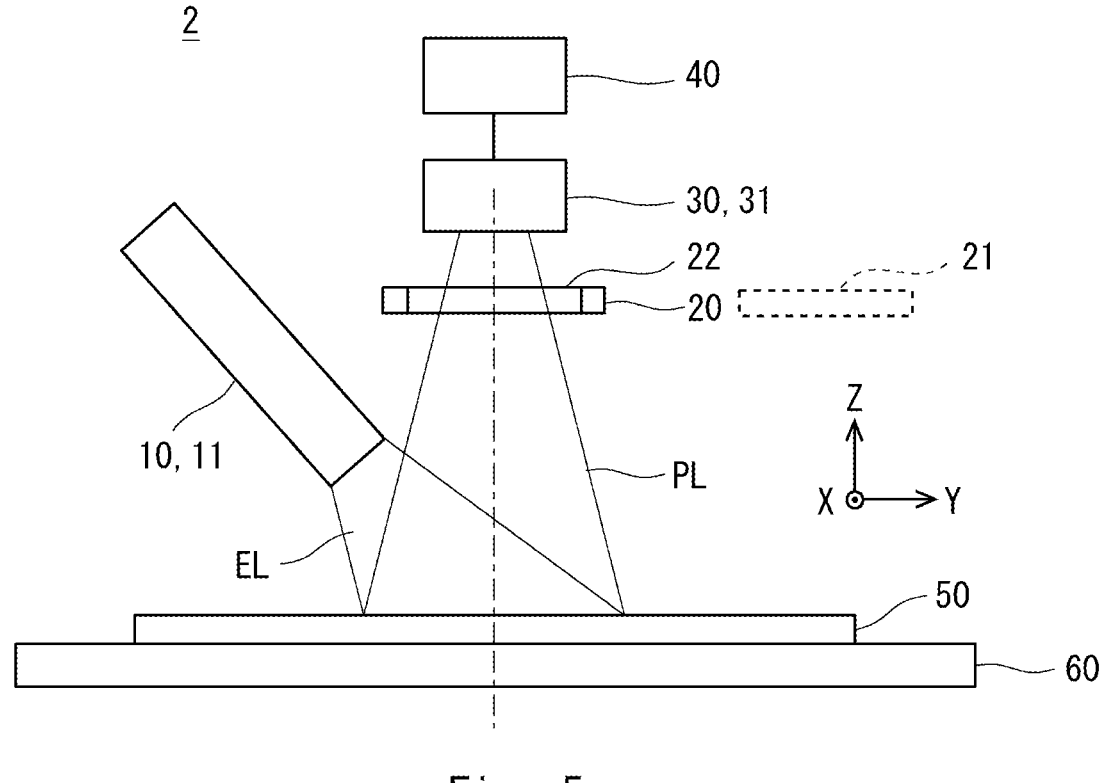
FIG. 5 is a block diagram illustrating a defect inspection apparatus according to an embodiment 2.

Next, a defect inspection apparatus according to the embodiment 2 will be described. The defect inspection apparatus of the present embodiment changes the wavelength band of the photoluminescence light PL that the filter unit 20 transmits from the wavelength band including 420 nm or longer and 430 nm or shorter to the wavelength band including near infrared light. FIG. 5 is a block diagram illustrating the defect inspection apparatus according to the embodiment 2. As illustrated in FIG. 5, for the defect inspection apparatus 2 of the present embodiment, the filter 21 in the filter unit 20 is changed to the filter 22 as compared with the defect inspection apparatus 1 described above.

The detection optical system 30 detects the photoluminescence light PL including the near infrared light transmitted through the changed filter unit 20. The image processing unit 40 forms an image from the detected photoluminescence light PL including the near infrared light. The image formed from the photoluminescence light PL including the near infrared light is referred to as a near infrared image. The image processing unit 40 discriminates a defect captured in the near infrared image.

Figure 6:
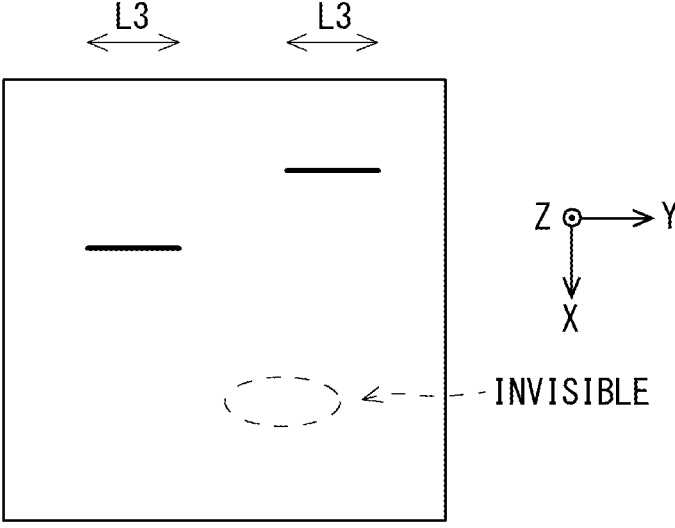
FIG. 6 is a schematic diagram illustrating an image formed by the image processing unit in the defect inspection apparatus according to the embodiment 2.

FIG. 6 is a schematic diagram illustrating the image formed by the image processing unit 40 in the defect inspection apparatus 2 according to the embodiment 2. FIG. 6 is a diagram in which an image of a position same as that in FIG. 3 in the sample 50 is captured. As illustrated in FIG. 6, the image processing unit 40 forms the near infrared image from the photoluminescence light PL of which the wavelength band including the near infrared light is transmitted. In this case, in the near infrared image, a linear defect is observed. A length of the linear defect is referred to as a third length L3. In FIG. 6, for the convenience of the description, the linear defect in the near infrared image is illustrated with a black line similarly to FIG. 3.

The image of the BPD in the buffer layer 52 is not captured in the near infrared image. The image of the TED in the drift layer 53 is not captured in the near infrared image. On the other hand, the image of the BPD in the drift layer 53 is captured in the near infrared image.

Here, the thickness of the drift layer 53 is defined as D1, the thickness of the buffer layer 52 is defined as D2, the offset angle is defined as θ, and the third length is defined as L3 indicated by an equation (3) below. Note that the thickness D1 of the drift layer 53 and the thickness D2 of the buffer layer 52 are desirably different from each other.

$$L3 = D1/\tan\theta \qquad (3)$$

Then, the defect having the length of the third length L3 corresponds to a defect K3 including the BPD in the drift layer 53. When the length of the defect is the third length L3, the image processing unit 40 discriminates the defect as the defect K3 including the BPD in the drift layer 53. The length of the defect K3 is not limited to the third length L3, and may include the third length L3 including an unavoidable error due to thickness dispersion or the like caused when forming the buffer layer 52 and the drift layer 53. Therefore, when the length of the defect captured in the near infrared image is in a predetermined third range including the third length L3, the third range being different from the first range and the second range, the image processing unit 40 discriminates the defect as the defect K3 including the BPD in the drift layer 53.

FIG. 7 is a diagram illustrating appearance of the BPD in the defect K1–the defect K3 captured in the defect inspection apparatus 1 according to the embodiment 1 and the defect inspection apparatus 2 according to the embodiment 2. As illustrated in FIG. 3 and FIG. 7, when the wavelength band including 420 nm or longer and 430 nm or shorter is transmitted, the defect K1 and the defect K2 are both captured in the image. On the other hand, as illustrated in FIG. 6 and FIG. 7, when the wavelength band including the near infrared light is transmitted, the defect K3 is captured in the near infrared image. The defect K1 and the defect K2 are not captured in the near infrared image. Note that the part of the defect K2 is subtracted from the defect K1 for the defect K3. Therefore, the third length L3 is a difference between the first length L1 and the second length L2.

In addition, the image processing unit 40 may calculate accuracy of the discriminated defect by comparing the number of the defects K1 having the length belonging to the first range and the number of the defects K3 having the length belonging to the third range. When the number of the defects K1 and the number of the defects K3 are closer, it is indicated that the accuracy of discriminating the defect is high.

Figure 8:
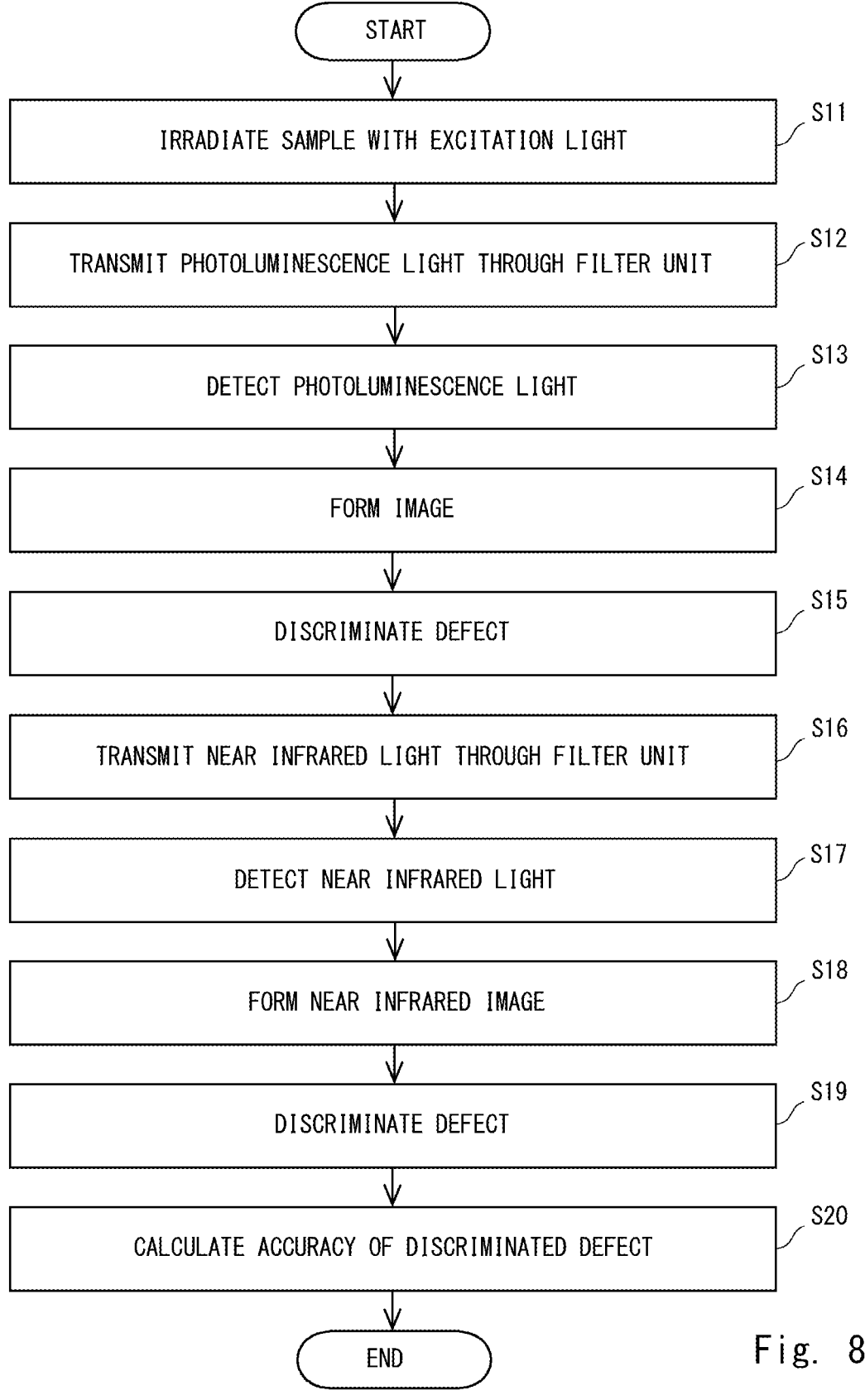
FIG. 8 is a flowchart illustrating a defect inspection method according to the embodiment 2.

Next, the defect inspection method of the present embodiment will be described. FIG. 8 is a flowchart illustrating the defect inspection method according to the embodiment 2. As illustrated in FIG. 8, the defect inspection method of the present embodiment includes, in addition to step S11–step S15 described above, step S16 of changing the wavelength band to be transmitted by the filter unit 20 to the near infrared light, step S17 of detecting the near infrared light, step S18 of forming the near infrared image from the near infrared light, and step S19 of discriminating the defect displayed in the image.

As illustrated in step S16, after step S15 of discriminating the defect, the wavelength band to be transmitted by the filter unit 20 is changed from the wavelength band including 420 nm or higher and 430 nm or shorter to the wavelength band including the near infrared light. Specifically, in the filter unit 20, the filter 21 is changed to the filter 22.

Next, as illustrated in step S17, the near infrared light transmitted through the changed filter unit 20 is detected.

Specifically, the detector 31 in the detection optical system 30 detects the near infrared light transmitted through the filter 22 in the filter unit 20.

Then, as illustrated in step S18, the image processing unit 40 forms the near infrared image from the near infrared light detected by the detection optical system 30.

Next, as illustrated in step S19, the image processing unit 40 discriminates the defect captured in the near infrared image. Specifically, when the length of the defect captured in the near infrared image belongs to the predetermined third range including the third length L3, the image processing unit 40 discriminates the defect as the defect K3 including the BPD in the drift layer 53. In such a manner, by discriminating the defect, the SiC epitaxial wafer can be inspected.

Note that, after step S19, a step may be provided further to calculate the accuracy of the discriminated defect by comparing the number of the defects K1 having the length belonging to the first range and the number of the defects K3 having the length belonging to the third range.

According to the present embodiment, the defect inspection apparatus 2 can discriminate the defect K3 captured in the near infrared image. Thus, the BPD in the drift layer 53 can be detected. In addition, the defect K1 captured in the image for which the wavelength band including 420 nm or longer and 430 nm or shorter and the defect K3 captured in the near infrared image can be compared, and a defect detection rate can be improved. The other configurations and effects are included in the description of the embodiment 1.

While the embodiments of the present disclosure are described above, the present disclosure includes appropriate modifications without damaging its objects and advantages, and moreover, is not limited by the embodiments described above. Further, combinations of the individual configurations of the embodiments 1 and 2 are also within the scope of technical ideas of the present disclosure.

The first and second embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A defect inspection apparatus comprising:

an irradiation optical system configured to irradiate a sample including a silicon carbide substrate, a buffer layer formed on the silicon carbide substrate, and a drift layer formed on the buffer layer with excitation light;

a filter unit configured to control a wavelength band to transmit photoluminescence light generated from the sample;

a detection optical system configured to detect the photoluminescence light transmitted through the filter unit; and an image processing unit configured to form an image from the detected photoluminescence light and to discriminate a defect captured in the formed image, wherein the filter unit transmits the wavelength band including 420 nm or longer and 430 nm or shorter in the photoluminescence light, and when a thickness of the drift layer is defined as D1, a thickness of the buffer layer is defined as D2, an offset angle is defined as $\theta$, and a first length and a second length are defined as $L1$ and $L2$ indicated respectively as follows:

$$L1 = (D1 + D2)/\tan\theta$$
$$L2 = D2/\tan\theta,$$

the image processing unit discriminates the defect as the defect including a basal plane dislocation continuing from the buffer layer to the drift layer in a case where a length of the defect belongs to a predetermined first range including the first length, and discriminates the defect as the defect including the basal plane dislocation in the buffer layer and an edge dislocation in the drift layer in the case where the length of the defect belongs to a predetermined second range including the second length, the second range being different from the first range.

2. The defect inspection apparatus according to claim 1, wherein the filter unit changes the wavelength band to be transmitted from the wavelength band including 420 nm or longer and 430 nm or shorter to the wavelength band including near infrared light, the detection optical system detects the near infrared light transmitted through the changed filter unit, and the image processing unit, when forming a near infrared image from the detected near infrared light and discriminating the defect captured in the formed near infrared image, in the case where a third length is defined as $L3$ indicated as follows:

$$L3 = D1/\tan\theta,$$

discriminates the defect as the defect including the basal plane dislocation in the drift layer in the case where the length of the defect belongs to a predetermined third range including the third length, the third range being different from the first range and the second range.

3. The defect inspection apparatus according to claim 2, wherein the image processing unit calculates accuracy of the discriminated defect by comparing the number of the defects having the length belonging to the first range and the number of the defects having the length belonging to the third range.

4. The defect inspection apparatus according to claim 1, wherein the image processing unit discriminates the defect captured in the image by using an algorithm for which the plurality of defects belonging to the first range and the plurality of defects belonging to the second range are machine-learned beforehand as learning data.

5. The defect inspection apparatus according to claim 1, wherein an impurity concentration of the drift layer is $1\times10^{15}$ cm$^{-3}$ or higher and lower than $5\times10^{17}$ cm$^{-3}$, and the impurity concentration of the buffer layer is $5\times10^{17}$ cm$^{-3}$ or higher and $1\times10^{19}$ cm$^{-3}$ or lower.

6. A defect inspection method comprising:

a step of irradiating a sample including a silicon carbide substrate, a buffer layer formed on the silicon carbide substrate, and a drift layer formed on the buffer layer with excitation light;

a step of transmitting photoluminescence light generated from the sample through a filter unit that controls a wavelength band to be transmitted;

a step of detecting the photoluminescence light transmitted through the filter unit;

a step of forming an image from the detected photoluminescence light; and a step of discriminating a defect captured in the formed image, wherein in the step of transmitting the photoluminescence light, the filter unit transmits the wavelength band including 420 nm or longer and 430 nm or shorter in the photoluminescence light, and in the step of discriminating the defect, when a thickness of the drift layer is defined as $D1$, a thickness of the buffer layer is defined as $D2$, an offset angle is defined as $\theta$, and a first length and a second length are defined as $L1$ and $L2$ indicated respectively as follows:

$$L1 = (D1 + D2)/\tan\theta$$
$$L2 = D2/\tan\theta,$$

the defect is discriminated as the defect including a basal plane dislocation continuing from the buffer layer to the drift layer in a case where a length of the defect belongs to a predetermined first range including the first length, and the defect is discriminated as the defect including the basal plane dislocation in the buffer layer and an edge dislocation in the drift layer in the case where the length of the defect belongs to a predetermined second range including the second length, the second range being different from the first range.

7. The defect inspection method according to claim 6, further comprising:

a step of changing the wavelength band to be transmitted by the filter unit from the wavelength band including 420 nm or longer and 430 nm or shorter to the wavelength band including near infrared light, after the step of discriminating the defect;

a step of detecting near infrared light transmitted through the changed filter unit;

a step of forming a near infrared image from the detected near infrared light; and a step of discriminating the defect captured in the formed near infrared image, wherein in the step of discriminating the defect captured in the near infrared image, when a third length is defined as $L3$ indicated as follows:

$$L3 = D1/\tan\theta,$$

the defect is discriminated as the defect including the basal plane dislocation in the drift layer in the case where the length of the defect captured in the near infrared image belongs to a predetermined third range including the third length, the third range being different from the first range and the second range.

8. The defect inspection method according to claim 7, further comprising a step of calculating accuracy of the discriminated defect by comparing the number of the defects having the length belonging to the first range and the number of the defects having the length belonging to the third range.

9. The defect inspection method according to claim 6, wherein in the step of discriminating the defect, the defect captured in the image is discriminated by using an algorithm for which the plurality of defects belonging to the first range and the plurality of defects belonging to the second range are machine-learned beforehand as learning data.

10. The defect inspection method according to claim 6, wherein an impurity concentration of the drift layer is $1 \times 10^{15}$ cm$^{-3}$ or higher and lower than $5 \times 10^{17}$ cm$^{-3}$, and the impurity concentration of the buffer layer is $5 \times 10^{17}$ cm$^{-3}$ or higher and $1 \times 10^{19}$ cm$^{-3}$ or lower.

\* \* \* \* \*